United States Patent
Basu et al.

(10) Patent No.: US 9,865,688 B2
(45) Date of Patent: Jan. 9, 2018

(54) DEVICE ISOLATION USING PREFERENTIAL OXIDATION OF THE BULK SUBSTRATE

(71) Applicant: International Business Machines Corporation, Armonk, NY (US)

(72) Inventors: Anirban Basu, Yorktown Heights, NY (US); Guy M. Cohen, Yorktown Heights, NY (US); Amlan Majumdar, Yorktown Heights, NY (US); Yu Zhu, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 8 days.

(21) Appl. No.: 14/213,511

(22) Filed: Mar. 14, 2014

(65) Prior Publication Data

US 2015/0263102 A1 Sep. 17, 2015

(51) Int. Cl.
| | |
|---|---|
| *H01L 29/205* | (2006.01) |
| *H01L 23/522* | (2006.01) |
| *H01L 29/66* | (2006.01) |
| *H01L 21/762* | (2006.01) |
| *H01L 21/311* | (2006.01) |
| *H01L 21/3105* | (2006.01) |
| *H01L 21/02* | (2006.01) |
| *H01L 29/78* | (2006.01) |
| *H01L 21/306* | (2006.01) |

(52) U.S. Cl.
CPC .......... *H01L 29/205* (2013.01); *H01L 21/762* (2013.01); *H01L 29/66795* (2013.01); *H01L 29/785* (2013.01); *H01L 21/02241* (2013.01)

(58) Field of Classification Search
None
See application file for complete search history.

(56) References Cited

U.S. PATENT DOCUMENTS

| | | | |
|---|---|---|---|
| 7,215,692 B2 | 5/2007 | Jewell | |
| 7,300,837 B2* | 11/2007 | Chen | H01L 29/66628 257/E21.43 |
| 2005/0243881 A1 | 11/2005 | Kwon et al. | |
| 2007/0221956 A1* | 9/2007 | Inaba | H01L 21/823807 257/197 |
| 2008/0224183 A1* | 9/2008 | Nawaz | 257/279 |
| 2008/0227246 A1* | 9/2008 | Chiu | H01L 29/201 438/172 |
| 2009/0278196 A1* | 11/2009 | Chang | H01L 21/823412 257/328 |

(Continued)

OTHER PUBLICATIONS

Lee et al., "InA1As/InGaAs Metamorphic High Electron Mobility Transistor with a Liquid Phase Oxidized InAlAs as Gate Dielectric", In Proc. 2005 IEEE Conference on Electron Devices and Solid-State Circuits, pp. 613-616 (2005).

(Continued)

*Primary Examiner* — Michael Lebentritt
*Assistant Examiner* — Jordan Klein
(74) *Attorney, Agent, or Firm* — Louis J. Percello, Esq.; McGinn IP Law Group, PLLC

(57) ABSTRACT

A structure and method for forming a substrate, a buffer layer disposed on the substrate, an oxide layer disposed on the buffer layer, and a fin comprising a semiconductor material disposed on the oxide layer.

5 Claims, 8 Drawing Sheets

(56) References Cited

U.S. PATENT DOCUMENTS

| | | |
|---|---|---|
| 2010/0301390 A1 | 12/2010 | Ko et al. |
| 2011/0018033 A1 | 1/2011 | Takenaka et al. |
| 2013/0005127 A1 | 1/2013 | Yin et al. |
| 2013/0099282 A1* | 4/2013 | Chen ................ H01L 29/66795 257/190 |
| 2013/0099283 A1 | 4/2013 | Lin et al. |
| 2014/0285980 A1* | 9/2014 | Cappellani ............. H01L 21/76 361/748 |

OTHER PUBLICATIONS

Paul et al., "Oxidation of InAlAs and its Application to Gate Insulator of InAlAs/InGaAs Metal Oxide Semiconductor High Electron Mobility Transistor", Japanese Journal of Applied Physics vol. 44, No. 3, pp. 1174-1180 (2005).

Wheeler et al., "Monolithic integration of GaAs optoelectronic devices using thermal oxide isolation (TOI)". Proc. International Society for Optics and Photonics conference Photonics West'97, pp. 75-84 (1997).

Gebretsadik et al., "Lateral oxidation of InAlAs in InP-based heterostructures for long wavelength vertical cavity surface emitting laser applications", Appl. Phys. Lett. 72 (2), pp. 135-137 (1998).

Hussey et al., "Characterization of Oxides Formed on InP, InGaAs, InAlAs, and InGaAs/InAlAs Heterostructures at 300-500° C.", Oxidation of Metals, vol. 57, # 5-6, pp. 427-447 (2002).

Parikh et al., "First demonstration of GaAs on insulator (GOI) technology", Digest of the 54th Annual IEEE Device Research Conference, pp. 134-135 (1996).

* cited by examiner

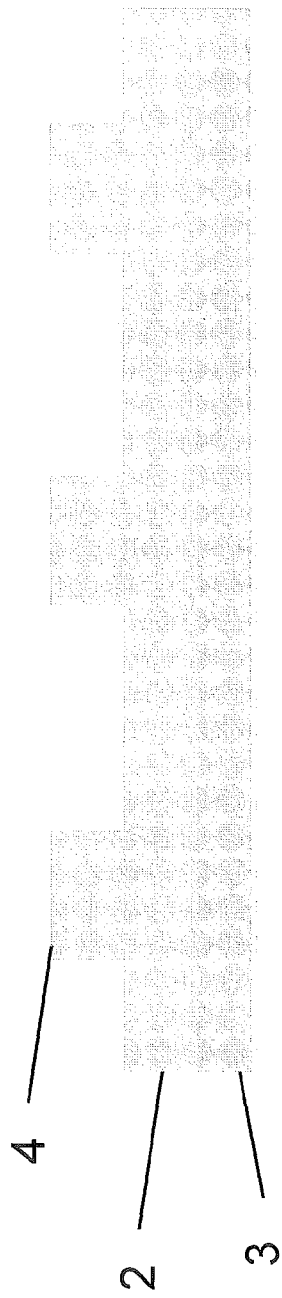
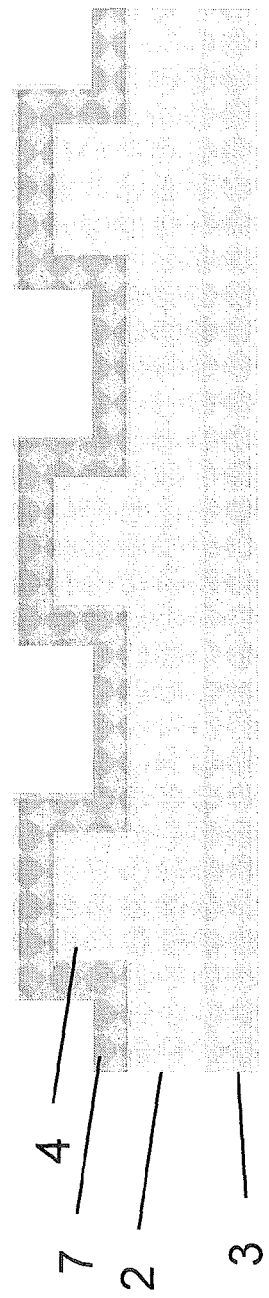
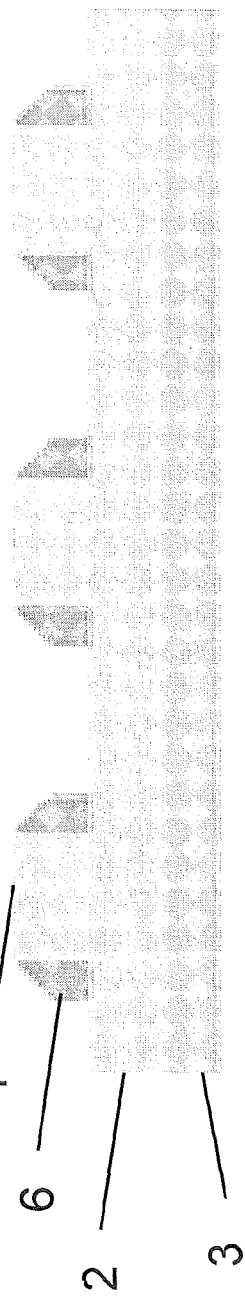
Figure 9A
Figure 9B
Figure 9C

DEVICE ISOLATION USING PREFERENTIAL OXIDATION OF THE BULK SUBSTRATE

BACKGROUND OF THE INVENTION

Field of the Invention

The present invention generally relates to a semiconductor device having an oxide layer between a fin and the buffer layer. In particular, an aspect of the invention relates to a semiconductor device having a layer of InAlAs oxide between the InGaAs fin and the semiconductor buffer layer.

Description of the Related Art

InGaAs is a leading III-V candidate for a NMOS option in CMOS technology. InGaAs epi is usually grown on lattice matched In on InP. Although InAlAs is not intentionally doped, device isolation is a critical issue in the absence of a trench isolation technique, such as those is available in Si technology.

SUMMARY OF THE INVENTION

While InAlAs is a wide band-gap semiconductor, it is not entirely insulating. Thus, devices, such as transistors, built on an InAlAs substrate may be shorted or connected to each other through the InAlAs layer or through the substrate on which the InAlAs layer is grown. This creates a problem utilizing InAlAs as a medium on which to grow InGaAs epi out of which devices are built, as sufficient device isolation may not be achieved.

In view of the foregoing, and other, exemplary problems, drawbacks, and disadvantages of the conventional systems, it is an exemplary aspect of the present invention to provide a method and structure to realize sufficient device isolation.

In a first exemplary aspect of the invention, to achieve the above and other features and purposes, described herein is a structure including a semiconductor substrate, a semiconductor buffer layer disposed on the substrate, an oxide layer disposed on the buffer layer, and a fin comprising a semiconducting material disposed on the oxide layer wherein said fin and said buffer layer are epitaxially aligned to said substrate.

Another exemplary aspect of the invention is a method including providing a structure having substrate, a buffer layer formed on the substrate and a semiconductor layer formed on the buffer layer, etching the semiconductor layer so as to form a fin and exposing the buffer layer, etching the buffer layer such that a portion of the buffer layer disposed under the fin is exposed, and oxidizing the buffer layer and fin so as to form an oxide layer under the fin.

The above aspects may allow devices or fins to be isolated from the buffer layer.

BRIEF DESCRIPTION OF THE DRAWINGS

The foregoing and other purposes, aspects and advantages will be better understood from the following detailed description of exemplary embodiments of the invention with reference to the drawings, in which:

FIGS. 9A-9C illustrate the exemplary process of forming the sidewalls;

DETAILED DESCRIPTION OF EXEMPLARY EMBODIMENTS OF THE INVENTION

Figure 1:
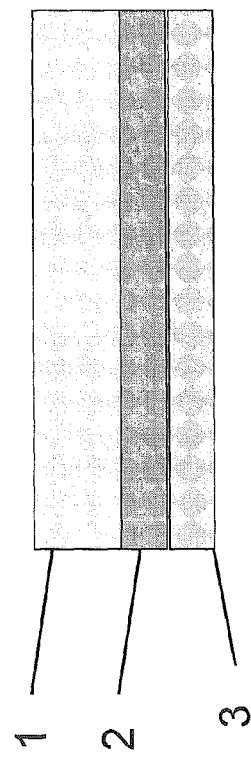
FIG. 1 illustrates an exemplary embodiment of the starting structure.

Referring now to the drawings, and more particularly to FIGS. 1-14, there are shown exemplary embodiments of methods and structures according to the present invention. It is noted that the Figures are not to scale.

An exemplary aspect of the invention proposes an isolation technique by local oxidation of an aluminum containing semiconductor by taking advantage of the differential oxidation rate of aluminum containing semiconductors compared to InGaAs. For example, the aluminum containing semiconductors include InAlAs, AlGaAs and AlAs. Using proper reaction conditions, such as in an environment of moist N2 (N2 passed through water at around 95° C.), an oxidation rate of InAlAs 10× to 80× faster than InGaAs is possible. In some instances, the oxidation rate of InAlAs can be 120× faster than InGaAs. Premchander Perumal et al., "Investigations of the characteristics of strain-free oxidation on InAlAs epilayer lattice matched to indium phosphide" Appl. Phys. Lett. 88, 201914 (2006), H. Gebretsadik et al., "Lateral oxidation of InAlAs in InP-based heterostructures for long, and wavelength vertical cavity surface emitting laser applications", Appl. Phys. Lett. 72 (2), 12 Jan. (1998) K. D. Choquette et al. "Advances in Selective Wet Oxidation of AlGaAs Alloys", IEEE JOURNAL OF SELECTED TOPICS IN QUANTUM ELECTRONICS, VOL. 3(3), (1997) describe oxidation processes and are each incorporated herein by reference in their entirety.

By slightly undercutting the bottom of the fin, it is possible to oxidize the buffer layer under the fin, leading to a realization of a silicon-on-insulator (SOI) equivalent platform.

Figure 4:
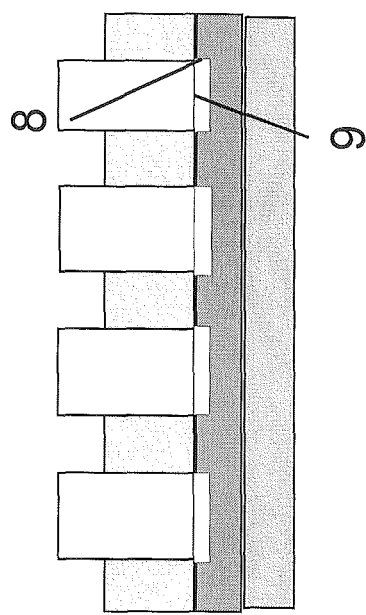
FIG. 4 illustrates an exemplary embodiment after the buffer layer has been etched.
Figure 5:
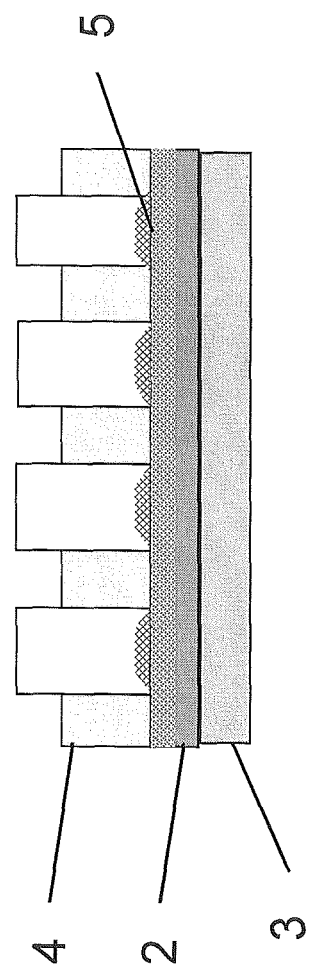
FIG. 5 illustrates an exemplary embodiment after the oxidation layer is formed.
Figure 6:
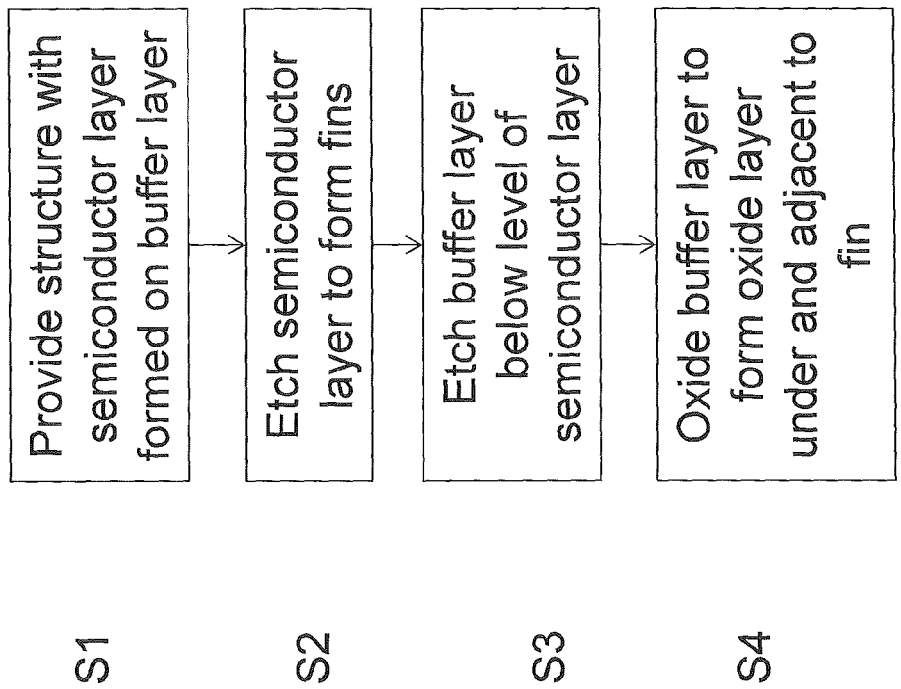
FIG. 6 illustrates an exemplary method.

FIGS. 1-6 illustrate an exemplary embodiment of the invention. FIG. 6 illustrates an exemplary method and is described in reference to exemplary FIGS. 1-5.

FIG. 1 illustrates an Indium Gallium Arsenide (InGaAs) layer 1, formed on a buffer layer 2 of Indium Aluminum Arsenide (InAlAs) which is in turn formed on a substrate 3 of Indium Phosphide (InP) (S1). The InGaAs is a semiconductor compound that is latticed matched to the InP substrate when the indium composition is 53% (i.e $In_{0.53}Ga_{0.47}As$). The InAlAs is latticed matched to the InP substrate when the indium content in the alloy is 50% (i.e. $In_{0.5}Al_{0.5}As$). Forming the InGaAs layer and the InAlAs layer is typically done using epitaxy (a process where the deposited crystal mimics the underlay substrate crystal structure). Typical epitaxial deposition methods include metal-organic molecular beam epitaxy (MOMBE) and metal-organic chemical vapor deposition (MOCVD).

In an exemplary embodiment of the invention, the fin and the buffer layer are epitaxially aligned to said substrate. In an exemplary embodiment of the invention, all of the semiconductor layers can be epitaxial (e.g., registered with respect to each other with the same crystal structure order and orientation).

Figure 3:
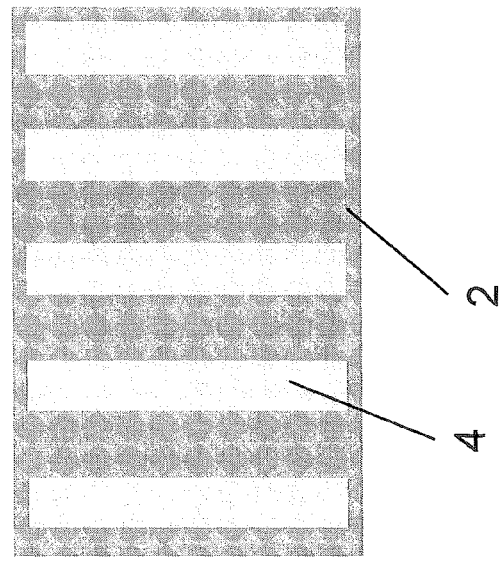
FIG. 3 illustrates a top view of exemplary FIG. 2.
Figure 2:
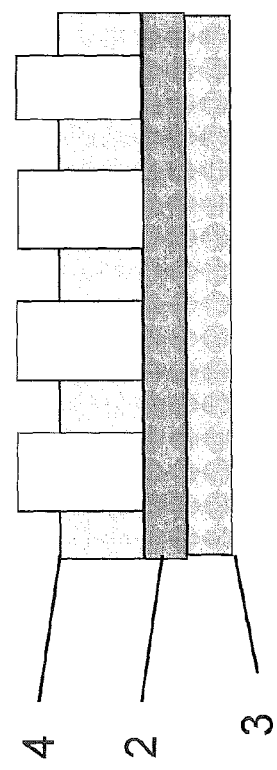
FIG. 2 illustrates an exemplary embodiment in which fins are formed.

A subtractive process (S2) is then performed, such as reactive-ion etching, in which part of the InGaAs layer is removed to form fins 4. An exemplary resultant structure is illustrated in FIGS. 2 and 3.

As shown in FIG. 4, buffer layer 2 is also etched so as to remove a portion of the InAlAs between the fins 4 such that the buffer layer 2 under fins 4 is exposed (S3).

In an embodiment, a portion of the buffer layer 2 located under fins 4 may also be removed.

The structure is then oxidized (S4), resulting in the structure of exemplary FIG. 5. In an exemplary embodiment, a preferential oxidation of the InAlAs is performed so that a layer of oxide 5 is formed underneath and between fins 4.

This process may be completed by using an oxidation process which is preferential to InAlAs. Such an oxidation process can oxidize InAlAs at many times the rate of the oxidation of InGaAs. For example, exemplary methods of oxidation allow the InAlAs to have an oxidation rate of eighty to one-hundred and twenty times that of InGaAs. Thus, a fin 4 may be isolated from the InAlAs layer 2 and the substrate 3.

As the InAlAs layer 2 was slightly etched, during the oxidation of the structure the sidewalls 8 of the InAlAs groove 9 adjacent to the fin 4 allows those sidewalls 8 to oxidize. In other words, because the side of InAlAs layer under the InGaAs is exposed, the portion of the InAlAs under the InGaAs can be effectively oxidized.

As shown in FIG. 5, because the oxidation rate of InAlAs is much greater than the oxidation rate of InGaAs, an oxidation layer 5 is formed under and between fins 4, while fins 4 are not substantially oxidized (e.g., the oxidation of fins 4 is minimal/negligible). In the exemplary embodiment, such as the embodiment of FIG. 5, the oxidation layer 5 extends under the entire width of fin 4 so that fin 4 is isolated from buffer layer 2 and the substrate 3.

In an exemplary embodiment, the oxidation is conducted so that the depth (D) of the oxidation layer 5 between fins 4 is the same as one half the width (W) of a fin 4. Alternatively, the depth (D) of the oxidation layer 5 between fins 4 can be slightly larger than one half the width (W) of a fin 4. Having a slightly larger depth to width ratio may help ensure that layer 5 (formed of oxidized InAlAs) is formed along the entire width (W) of fin 4. This can ensure that fin 4 is electrically isolated from InAlAs layer 2.

Figure 12:
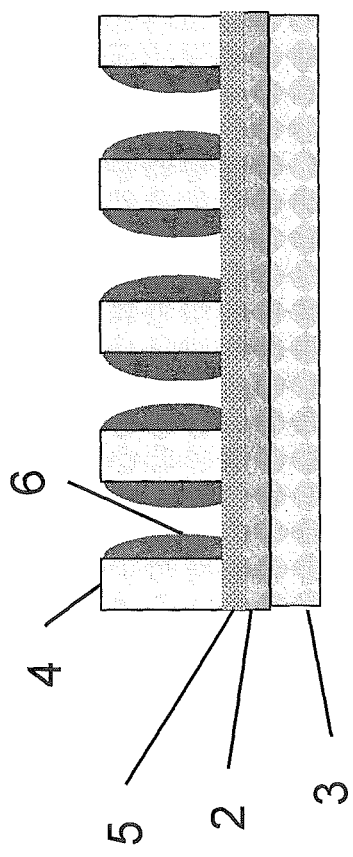
FIG. 12 illustrates an exemplary structure after the oxidation layer is formed.
Figure 13:
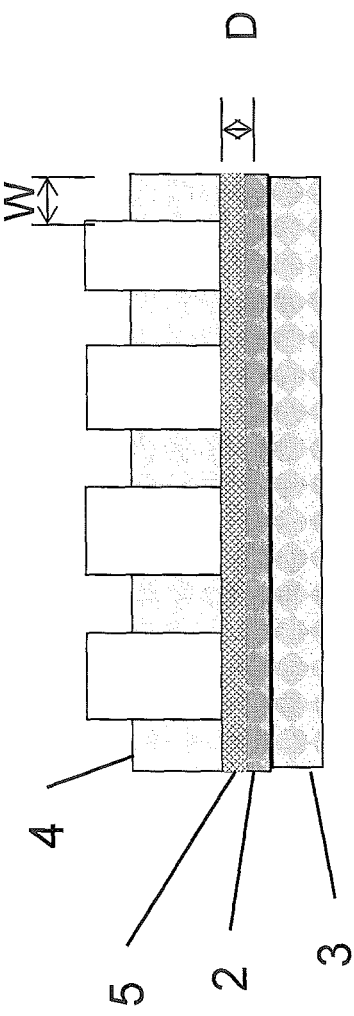
FIG. 13 illustrates an exemplary structure after the sidewalls are removed.
Figure 14:
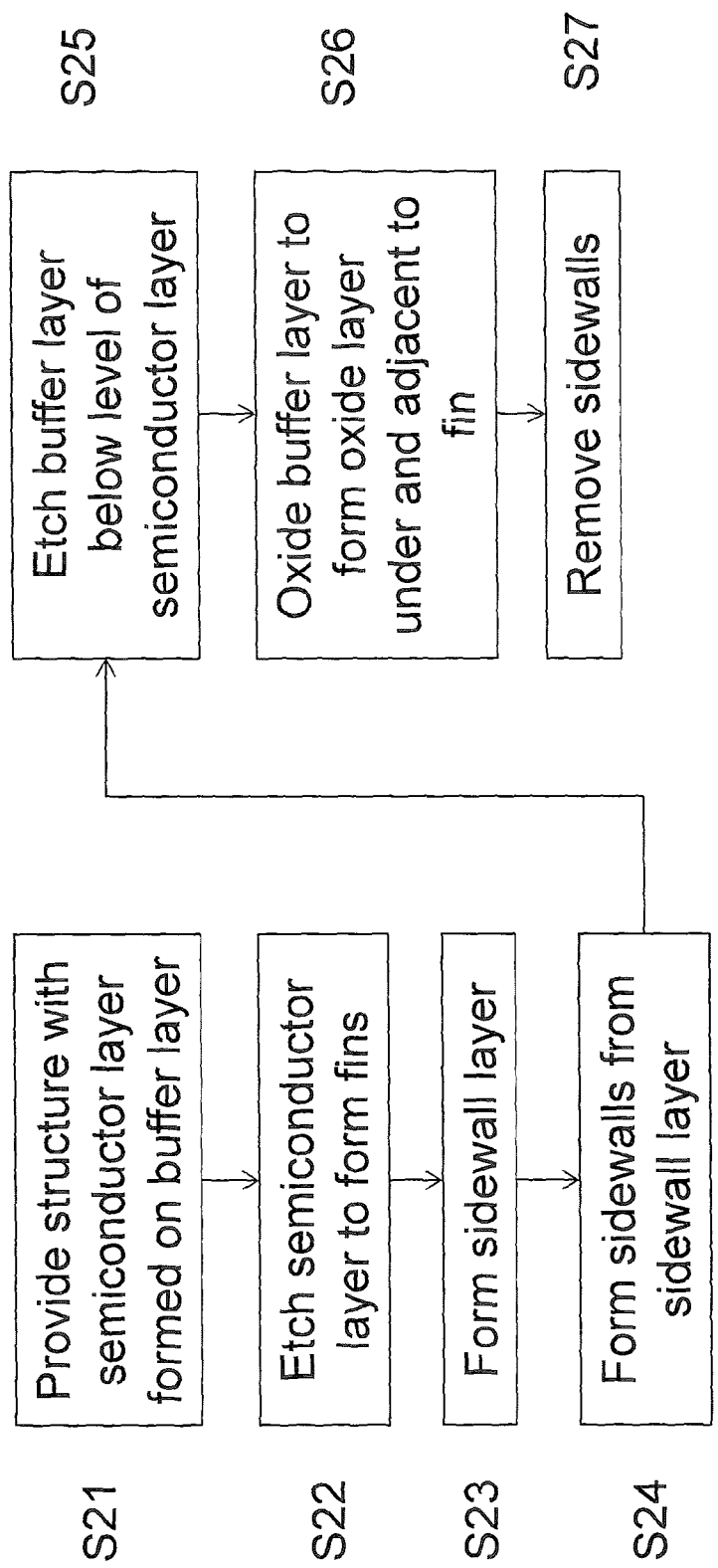
FIG. 14 illustrates an exemplary method in which sidewalls are utilized.

Another exemplary process, as illustrated in FIGS. 7-14, can provide further protection to the fins and/or can allow the oxidation process to be performed where preferential oxidation is not present. FIGS. 7-13 illustrate an exemplary structure, and FIG. 14 illustrates an exemplary method which will be described in reference to exemplary FIGS. 7-13.

Figure 7:
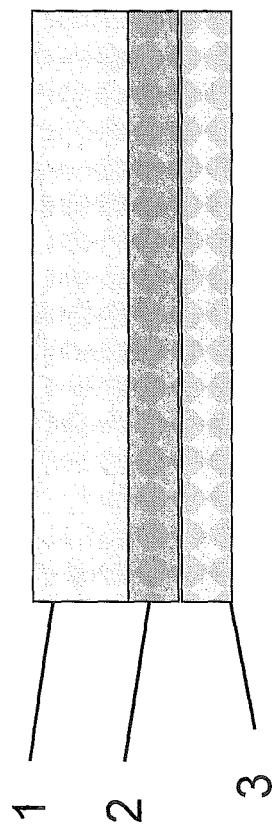
FIG. 7 illustrates another exemplary structure of the starting structure.
Figure 8:
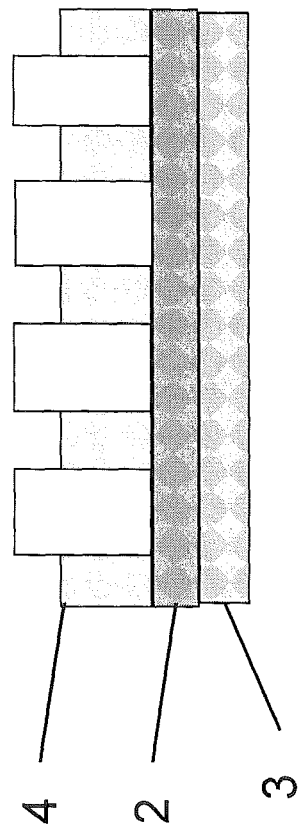
FIG. 8 illustrates another exemplary structure in which fins are formed.

Initially, a layered device such as that of FIG. 7 is provided (S21). The device may include a semiconductor layer 1 (e.g., InGaAs), buffer layer 2 (e.g., InAlAs), and substrate 3 (e.g., InP). The semiconductor layer is subjected to a subtractive process so as to produce fins 4 on a buffer layer 2 (S22). An exemplary result of an etching is shown in FIG. 8.

As shown in FIGS. 9A-9C, a sidewall layer 7 may be formed on fins 4 and buffer layer 2 (S23). The sidewall layer 7 can then be etched so as to remove a thickness of the sidewall layer 7 sufficient to expose the buffer layer 2 between fins 4 (S24). In one exemplary embodiment, once a certain thickness of layer 7 is removed, sidewalls 6 will naturally be formed adjacent fins 4.

The process for producing the sidewalls 6 is not particularly limited. For example, the sidewall layer 7 may be formed of silicon nitride or silicon dioxide. The sidewall layer 7 can be etched using a direction dry etching process, such as RIE, to form the sidewalls 6. Thus, the sidewalls 6 can be formed without the use of a mask.

Figure 10:
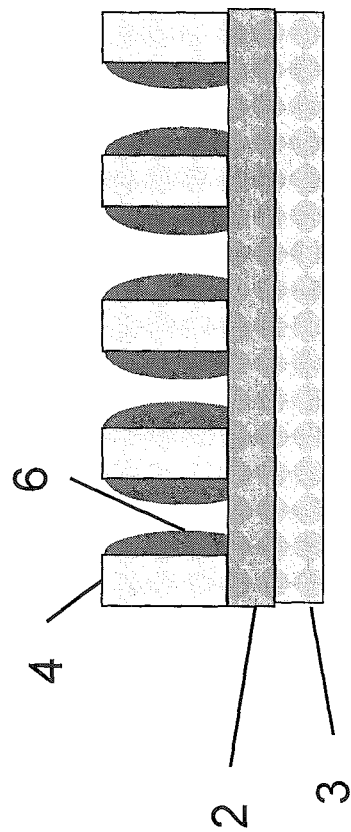
FIG. 10 illustrates an exemplary structure after the sidewalls have been formed.
Figure 11:
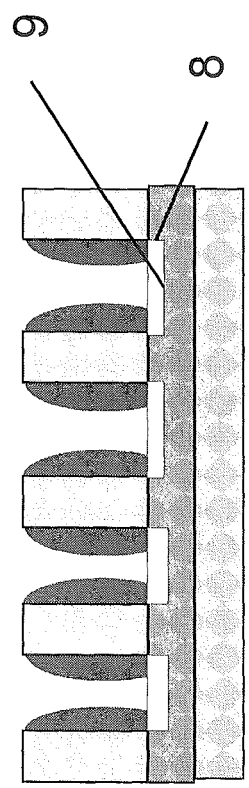
FIG. 11 illustrates an exemplary structure after the buffer layer has been etched.

After the sidewalls 6 are formed on fins 4, as shown in FIG. 10, the buffer layer 2 may be subjected to a subtractive process (e.g., etched) so as to expose a portion of the buffer layer 2 below the fins 4 (S25).

After the buffer layer 2 is etched, the structure can be oxidized (S26), the results of which may be seen in FIG. 12. Because the sides of fins 4 are covered with sidewalls 6, the sides of the fins 4 are protected from oxidation. Thus, the area of buffer layer 2 beneath and adjacent to the fins 4 is oxidized to form oxide layer 5 so as to isolate fins 4 from the layer buffer 2.

Because the sidewalls 6 protect fins 4 from oxidation this process does not require preferential oxidation of layer 2 versus fins 4. In other words, this process can be applied to materials other than InAlAs and InGaAs, or the process can be applied to InAlAs and InGaAs in oxidation environments which are not preferential to InAlAs. As a side note, the top of the fins 4 may be protected by the hard mask (not drawn) that was used to define the fins.

Alternatively, sidewalls 6 can be applied to fins 4 in a process using preferential oxidation in order to further protect the fins 4 from oxidation which the buffer layer is oxidized. Thus, the addition of sidewalls 6, as described above or by other known means, can be applied to fins 4 while using preferential oxidation in order to provide extra protection for fins 4, or the sidewalls 6 can be used as protection for fins 4 for processes which do not use preferential oxidation.

Once the oxidation process is completed, the sidewalls 6 can then be removed (S27), resulting in exemplary FIG. 13. The process for removing sidewalls 6 is not particularly limited. For example, sidewalls 6 can be removed using the same chemistry used by the etching process which formed sidewalls 6 from layer 7 but without the directionality. For example, the RIE process can be used with a lower bias and a higher pressure to render the etching process to be isotropic.

As a result of the exemplary processes, a structure may be formed where fins 4 are isolated from one another and buffer layer 2 through the use of oxide layer 5. An exemplary embodiment of such a structure is illustrated in FIGS. 5 and 13. In FIGS. 5 and 13, a buffer layer 2 is disposed on a substrate 3, an oxide layer 5 is disposed on the buffer layer 2, and one or more fins 4 are disposed on the oxide layer 5.

The materials used for each layer may vary and are not particularly limited. For a device formed using preferential oxidation (with or without sidewalls), the substrate 1 may be formed of InP, the buffer layer 2 may be formed of InAlAs, the oxide layer 5 may be formed of an oxide of InAlAs (e.g., $Al_2O_3$), and fins 4 may be formed of InGaAs.

In other embodiments, the substrate 1 may be formed of GaAs, the buffer layer 2 may be formed of AlGaAs, the oxide layer 5 may be formed of $Al_2O_3$ and fins 4 may be formed of GaAs. Such a structure may be formed using preferential oxidation, sidewalls 6, or both, as noted above.

In FIGS. 5 and 13, it can be seen that oxide layer 5 isolates the fins 4 from the buffer layer 2 and the substrate 3. Interconnects may also be formed between fins 4 on oxide layer 5, as desired, using conventional methods.

The dimensions of the layer thicknesses and width of the fin can vary depending on the particular needs of the device and the relative oxide rates of the layers. For instance, in some applications the buffer layer 2 may be formed of InAlAs with a thickness from 10 nm to 500 nm, with a more typical thickness of around 100 nm. Fins 4 may be formed of InGaAs having a thickness of 10-100 nm, depending on the application. In an exemplary embodiment, if the width of the fins 4 is 30 nm, for example, then the oxide layer 5 may be approximately 15-20 nm thick, assuming a constant rate of oxidation on all exposed surfaces of the buffer layer 2.

While the invention has been described in teens of exemplary embodiments, those skilled in the art will recognize that the invention can be practiced with modification within the spirit and scope of the appended claims.

Further, it is noted that, Applicant's intent is to encompass equivalents of all claim elements, even if amended later during prosecution.

The invention claimed is:

1. A structure, comprising:
a semiconductor substrate;
a semiconductor buffer layer disposed on the substrate;
an oxide layer disposed on the buffer layer; and
a first fin and a second fin, each comprising a semiconductor material disposed on the oxide layer,
wherein said first fin, said second fin, and said buffer layer are epitaxially aligned to said substrate,
wherein the oxide layer continuously extends from below a bottom surface of the first fin to below a bottom surface of the second fin,
wherein the oxide layer extends between a side surface of the first fin and a side surface of the second fin such that a thickness of the oxide layer extending between the first fin and the second fin is more than the thickness of the oxide layer extending between a top surface of buffer layer and the bottom surface of the first fin, and
wherein the first fin comprises a III-V semiconductor having an oxidation rate less than an oxidation rate of the buffer layer.

2. The structure according to claim 1, wherein the semiconductor substrate comprises InP, the semiconductor buffer layer comprises InAlAs, the oxide layer comprises $Al_2O_3$, and the first fin comprises InGaAs.

3. The structure according to claim 1, wherein the first fin is isolated from the semiconductor buffer layer by the oxide layer.

4. The structure according to claim 1, wherein interconnects are formed on the oxide layer so as to connect the first fin to the second fin disposed on the oxide layer.

5. The structure according to claim 1, wherein the first fin is lattice matched with the semiconductor buffer layer.

* * * * *